United States Patent [19]

Murooka

[11] 4,364,027

[45] Dec. 14, 1982

[54] CALIBRATION APPARATUS FOR ANALOG-TO-DIGITAL CONVERTER

[75] Inventor: Rikichi Murooka, Chiba, Japan

[73] Assignee: Sony/Tektronix, Tokyo, Japan

[21] Appl. No.: 232,481

[22] Filed: Feb. 9, 1981

[30] Foreign Application Priority Data

Sep. 16, 1980 [JP] Japan .................. 55-128181

[51] Int. Cl.³ ............................... H03K 13/02
[52] U.S. Cl. ................. 340/347 CC; 324/130; 324/121 R; 364/571
[58] Field of Search ............... 340/347 CC, 722, 724, 340/715; 364/571; 324/102, 100, 130, 121 R, 111, 74

[56] References Cited

U.S. PATENT DOCUMENTS 3,656,053  4/1972  Richman ............... 324/121 R
3,662,380  5/1972  Cargile ............... 340/347 CC

OTHER PUBLICATIONS

No Author, "Elektronik Schan" (Austria), vol. 54, No. 5, 1978, pp. 44-45.
Foord, "Radio & Electronics Constructor", vol. 28, No. 5, Dec. 1974, pp. 280-283.

*Primary Examiner*—C. D. Miller
*Attorney, Agent, or Firm*—George T. Noe

[57] ABSTRACT

A calibration apparatus for analog-to-digital converter or transient recorder including both analog and digital sections is disclosed. A built-in calibrator automatically calibrates the gain and DC level of the entire system to substantially the same accuracy as that of the digital section, thereby avoiding relatively large errors of the analog section. The amplitude or gain calibration is always performed over the full range of the digitizer used in the digital section.

14 Claims, 7 Drawing Figures

CALIBRATION APPARATUS FOR ANALOG-TO-DIGITAL CONVERTER

BACKGROUND AND SUMMARY OF THE INVENTION

This invention pertains to a calibration apparatus for an analog-to-digital converter best suited for a waveform observing apparatus utilizing an analog-to-digital converter (hereinafter referred to as ADC) which is also known as a transient recorder.

An electrical signal waveform measurement instrument such as an oscilloscope or similar apparatus typically exhibits an overall measurement error in the range of several percent. The accuracy is primarily determined by acceptable tolerance for particular applications and by allowable circuit complexity and component tolerances.

In accordance with the present invention, a waveform observing apparatus known as a transient recorder utilizing ADC has been developed to store an analog signal to be observed after digitizing it for reproducing the waveform of all or part of the stored digital data. This enables one to process an analog signal digitally by using a computer. In such an apparatus, analog signal can be converted into a digital signal with $\pm 0.4$ to $\pm 0.05\%$ error by using a 7 to 10 bits high resolution ADC.

The aforementioned waveform observing apparatus is provided with signal attenuator and amplifier stages for accepting a wide voltage range of analog signal. If the input stage including such signal attenuator and amplifier is designed with circuits of essentially the same accuracy as that of a conventional oscilloscope, the overall accuracy of the entire ADC is as poor as several percent despite very high accuracy of the digital section. That is, the overall accuracy is far from fractions of 1 percent which can be achieved by ADC itself. High precision attenuator and amplifier are very complicated and also very expensive.

It is therefore one object of the present invention to provide a device which automatically reduces error of the input circuit and also the error of ADC itself to substantially equal to that of an ADC by simply adding a simple circuit even if an input stage circuit of similar accuracy to conventional circuit may be used.

Other objects and attainments of the present invention will become apparent to those having ordinary skill in the art upon a reading of the following description when taken in conjunction with the accompanying drawings.

DETAILED DESCRIPTION OF THE INVENTION

Figure 1:
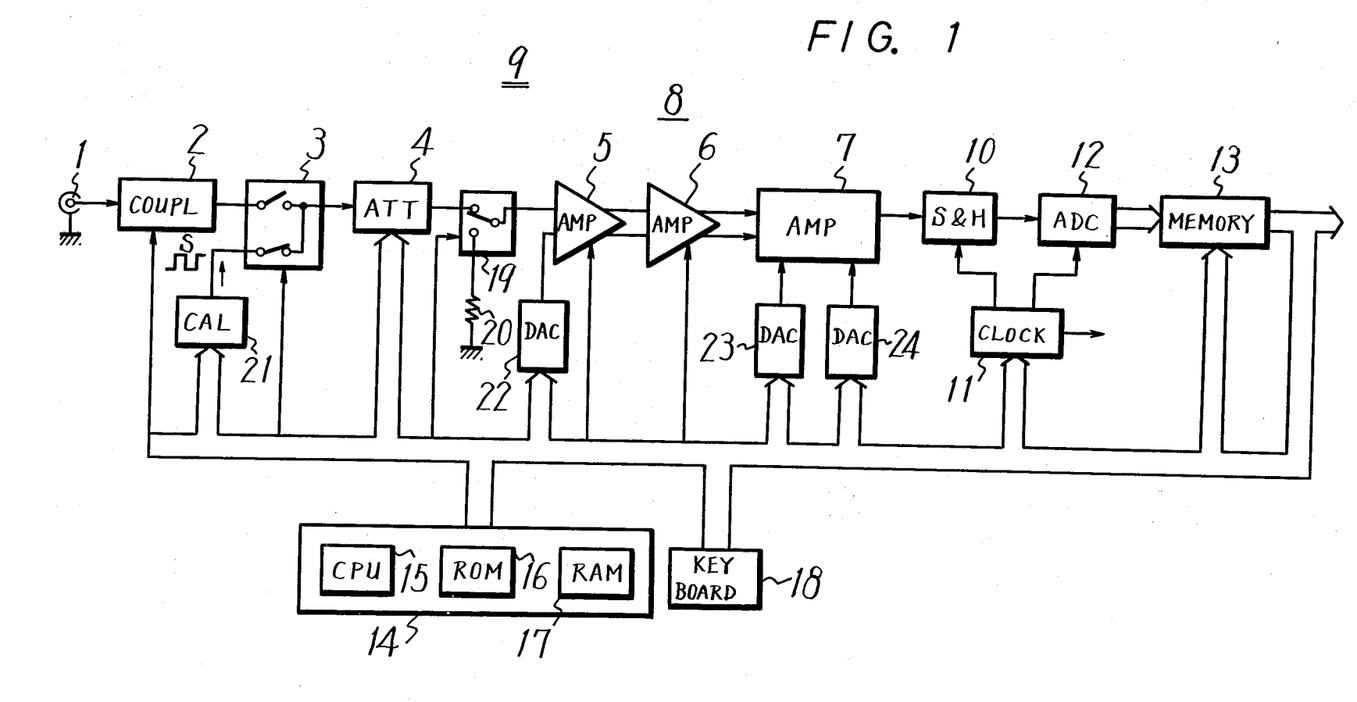
FIG. 1 is one exemplary block diagram of a calibration apparatus for an analog-to-digital converter in accordance with the present invention.

FIG. 1 is a block diagram of the calibration apparatus according to this invention. An analog signal to be observed is applid to input terminal 1 to which switching circuit 3 is coupled through coupling circuit (COUPL) 2 for selecting either AC or DC coupling of the applied signal. The output from coupling circuit 2 is applied to amplifier circuit 8 formed by first, second and third amplifiers 5, 6 and 7 connected in cascade manner at the output stage of attenuator (ATT) 4. Each of the amplifiers 5 through 7 is a DC coupled amplifier and the former two are balanced, or push-pull, amplifiers. First amplifier 5 is a switchable gain amplifier for selecting either $\times 1$ (unity) or $\times 2$ (twice) gain. Second amplifier 6 is designed to selectively provide either $\times 1$ or $\times 5$ gain. Third amplifier 7 is an amplifier, the DC level (DC component in the output signal) and gain of which can be varied at a desired value. The aforementioned attenuator 4 and amplifier circuit 8 define input stage circuit 9.

The output signal from third amplifier 7 is supplied to sample and hold (S and H) circuit 10 for sampling such signal under control of the clock signal from clock signal generator 11. The sampled data is then applied to ADC 12. ADC 12 converts the analog signal applied to the input terminal thereof into, for example, a 10 bit digital signal subsequently to be stored in memory 13.

Although not shown in the FIG. 1, the output signal from memory 13 is converted into an analog signal by a digital-to-analog converter (DAC) before being applied to an oscilloscope for reproducing the signal waveform and also to control circuit 14. Control circuit 14 may consist of well-known CPU 15, read only memory (ROM) 16 and random access memory (RAM) 17. Control circuit 14 is controlled by keyboard 18. Switch 19, which may be an electronic switch, is interposed in input circuit 9 to disconnect a signal transmission line at first amplifier 5. In the embodiment shown, switch 19 is disposed at the input terminal of first amplifier 5 to return the terminal to ground through resistor 20. However, this invention is not limited to this embodiment and the input end of attenuator 4, switching circuit 3, or the like may be chosen alternatively.

Signals from control circuit 14 control coupling circuit 2 to choose either AC or DC coupling, calibration signal generator circuit 21, switching circuit 3 and attenuation of attenuator 4. The control signals are also applied to switch 19 for on/off control thereof, and to first, second and third DAC's 22 through 24 for controlling the DC level of amplifier 8 by the output signals from first and second DAC's 22–23, and for controlling the gain of third amplifier 7 by the output from third DAC 24. First DAC 22 is used to control the vertical axis position under control of keyboard 18 through control circuit 14. The gain of first and second amplifiers 5 and 6 is also switched or controlled by the control circuit 14. In addition, control circuit 14 supplies a control signal to clock signal generator circuit 11 to control the repetition frequency of the clock signal, and also supplies a control signal to memory 13. Although not shown in FIG. 1, it is a matter of course that the clock signal is supplied to various circuits.

The operation of the circuit in FIG. 1 is as follows. First, the DC level correction operation of amplifier 8 will be described by reference to the flow chart in FIG. 2. The calibration instruction from keyboard 18 is received by control circuit 14 which switches the movable contact of switch 19 to resistor 20 and returns the input end of amplifier 8 to ground level for performing DC level correction. The ground level is chosen as the first reference level in this particular embodiment, however, any desired DC voltage may be used as the first reference level. Then, control circuit 14 supplies a digital signal to first DAC 22 to produce an offset voltage of first amplifier 5 that corresponds to the vertical axis position of the display. Amplifier 8 is operating under this condition to sample the DC signal by S & H circuit 10 under control of the clock signal from clock signal generator circuit 11. The samples are then converted into a digital signal representing the DC signal by ADC 12 at the subsequent stage.

Figure 2:
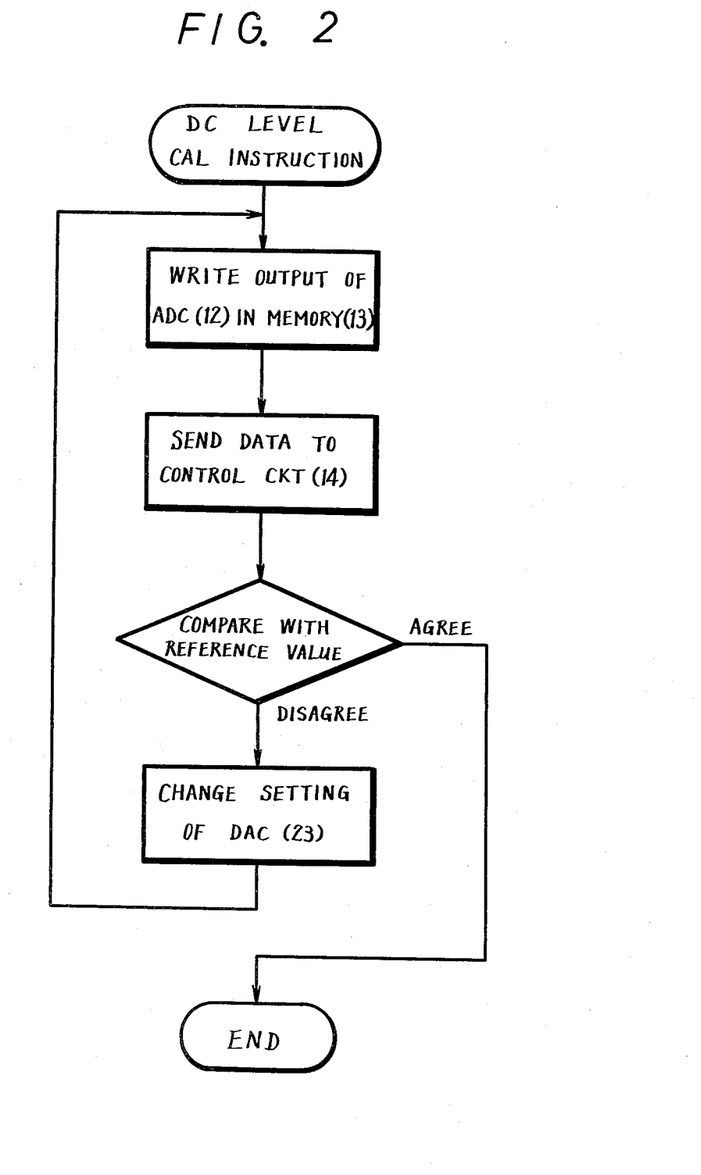
FIGS. 2 and 3 are flow charts for explaining the operation of the system of FIG. 1.

The output from ADC 12 is assumed to provide a fist reference value (e.g. 1000000000 if ten bit ADC is used) when the input end of amplifier circuit 8 is connected to the first reference level (or ground level in this particular embodiment). The setting can be stored in ROM 16 of control circuit 14.

The digital signal derived from ADC 12 is written in memory 13 and temporarily stored in control circuit 14 for comparison with the first reference value stored, for example, in ROM 16. The digital signal transmitted to second DAC 23 from control circuit 14 is modified if it disagrees with the first reference value in ROM 16. The foregoing operation is repeated until the output signal from ADC 12 agrees with the aforementioned first reference value. The digital signal from ADC 12 is therefore controlled automatically to the first reference value. That is, ADC 12 provides at its output terminal the digital signal representing the first reference level when the first reference level is applied to the input end of amplifier circuit 8, thereby performing an automatic DC level calibration.

Figure 3:
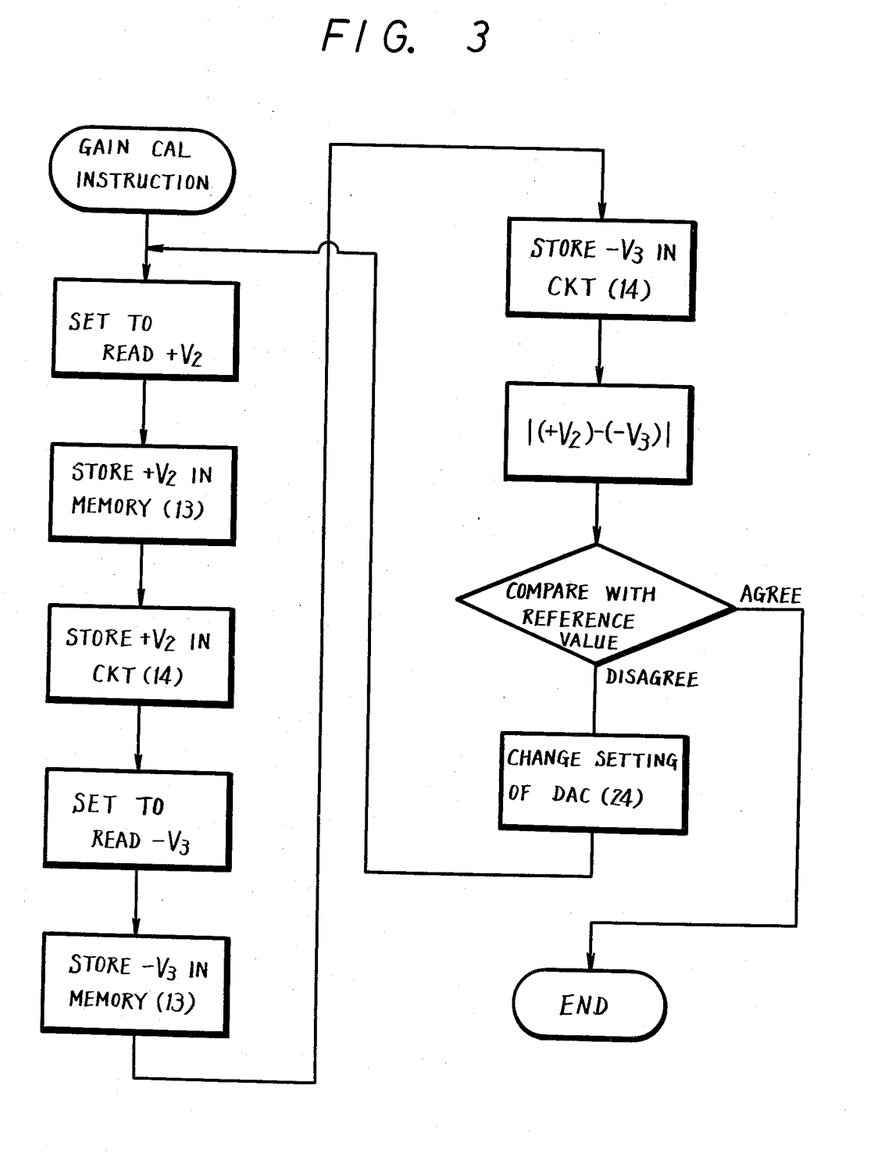
Figure 4:
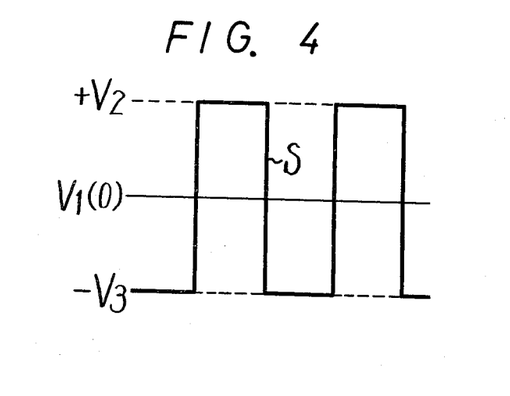
FIG. 4 is a signal waveform from the calibration signal generation portion of the apparatus of FIG. 1.

Then, gain calibration of amplifier circuit 8 will be described by reference to the flow chart in FIG. 3. On completing the DC level calibration, switching circuit 3 is switched to the position shown by the solid line in response to the control signal from control circuit 14. Simultaneously, the movable contact of switch 19 is switched to attenuator 4 and calibration signal generation circuit 21 is controlled to generate a calibration signal S which may be, for example, a rectangular signal. As shown in FIG. 4, the calibration signal S has a second reference level $+V_2$ higher than the first reference level $V_1$ (e.g. ground potential in this particular embodiment), and also a third reference level $-V_3$ lower than the first reference level $V_1$.

The calibration signal S is supplied to attenuator 4 through switch circuit 3 for attenuation and also to amplifier circuit 8 for amplification. The signal S is, then, sampled by sampling circuit 10 before being supplied to ADC 12 whose digital output is supplied to control circuit 14.

First, an instruction is sent from control circuit 14 to read the second reference level $+V_2$. The second reference level $+V_2$ is then sampled to store the corresponding digital signal in memory 13 and also in the memory section of control circuit 14. Control circuit 14 then sends an instruction to read the third reference level $-V_3$ of the calibration signal S. Similarly, the third reference level $-V_3$ is sampled before storing the corresponding digital signal in memory 13 as well as in the memory section of control circuit 14.

Subsequently, calculation is performed within control circuit 14 to obtain the difference between the reference levels $+V_2$ and $-V_3$. The result is compared with a reference value, e.g. previously stored in ROM 16. If they disagree, the setting of third DAC 24 is modified to repeat the foregoing operation until they agree with each other. The reference levels $+V_2$ and $-V_3$ are adjusted by control circuit 14 in accordance with the settings of attenuator 4 and amplifiers 5 and 6 so that they substantially equal the maximum and minimum level of the conversion range of ADC 12.

In the gain control, first DAC 22 keeps the vertical position of amplifier 8 zero and second DAC 23 provides the aforementioned DC level correction signal.

According to this apparatus mentioned hereinbefore, the calibration instruction from keyboard 18 automatically adjusts the DC level and gain of input stage circuit 9 to a desired value and also corrects any errors in the sections between the terminal to which the first, second and third reference levels $V_1$, $+V_2$, $-V_3$ are applied and the output terminal of ADC 12, thereby correcting any error in the entire system. In other words, the present invention corrects attenuation errors of attenuator 4, offset and gain error of amplifier circuit 8, offset and gain error due to long term drift and temperature variation of amplifier circuit 8 and conversion error of ADC 12.

More effective correction will result by alternately repeating the aforementioned DC level and gain calibration procedures. This invention described hereinbefore will eliminate any error in the analog signal circuit system in such a waveform observing apparatus employing ADC 12, thereby reducing the error of the entire system to substantially the same degree as the quantizing error of ADC 12. ADC's have become relatively inexpensive so that the technique of this invention can be applied to a conventional apparatus excluding ADC by utilizing such low cost ADC for achieving high accuracy of a display apparatus.

Figure 5:
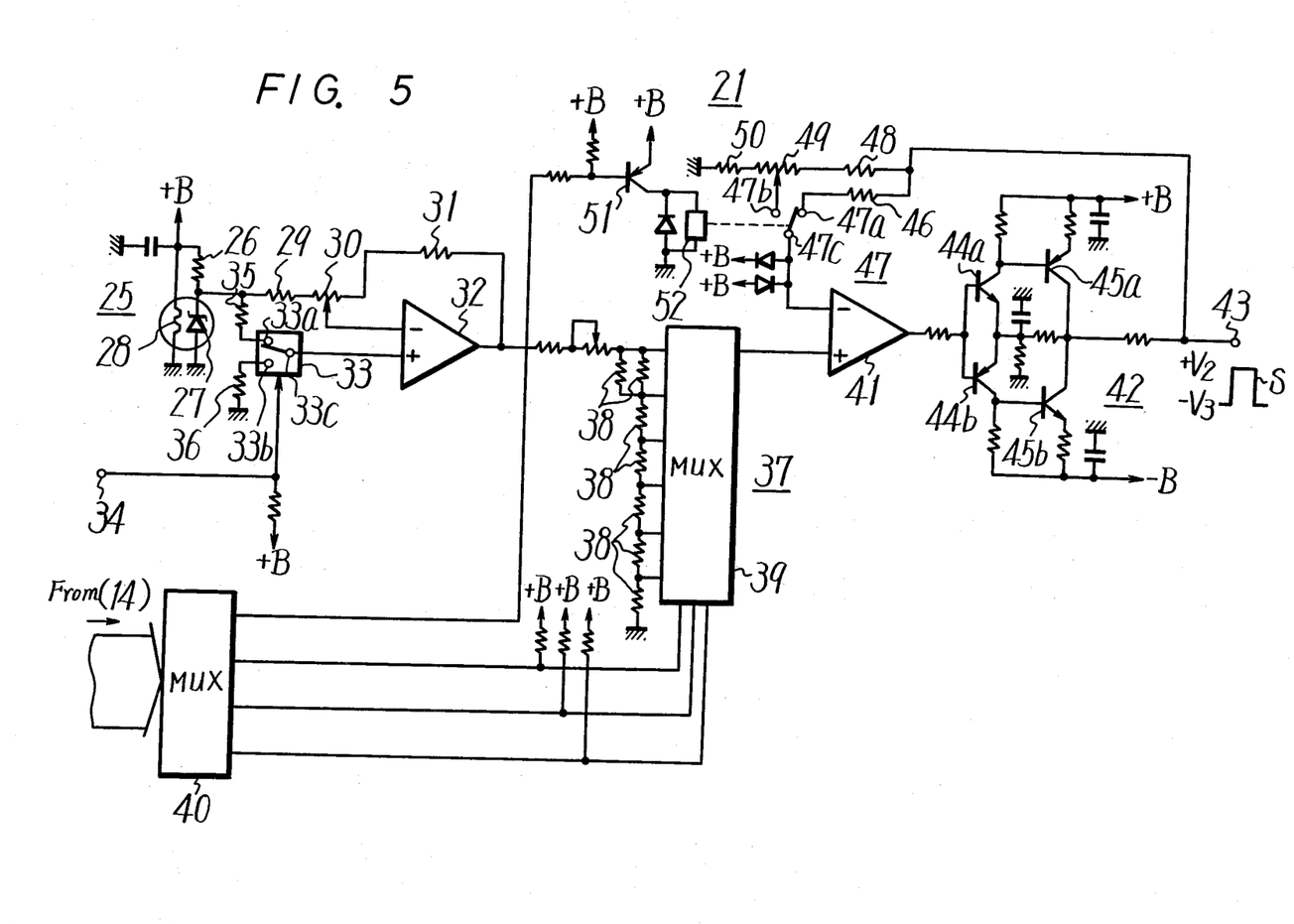
FIG. 5 is a detailed schematic diagram of a calibration signal generator circuit.

FIG. 5 is a detailed circuit schematic of calibration signal generation circuit 21 to be incorporated into this invention. Constant voltage generation circuit 25 includes a constant voltage element 27 such as a Zener diode or the like connected through resistor 26 between a positive voltage source and ground. Heater 28 maintains the temperature of Zener diode 27 constant by supplying a controllable current in response to the output of a temperature sensor (not shown), thereby developing a constant voltage across diode 27. The junction of resistor 26 and Zener diode 27 is coupled to the output terminal of operational amplifier 32 through resistor 29, potentiometer 30, and resistor 31, to the − input terminal of such operational amplifier 32 through the slider of potentiometer 30, and to + input terminal thereof through the movable contact 33C of switch 33. Switch 33 may be a so-called CMOS switch which operates on receiving the aforementioned clock signal (of a predetermined frequency, e.g., 1 KHz) from clock signal generator circuit 11 applied to input terminal 34. One fixed contact 33a is connected through resistor 35 to the aforementioned junction of resistor 26 and Zener diode 27, and the other fixed contact 33b is grounded through resistor 36.

Applied to voltage switching circuit 37 is the output signal from amplifier 32. This circuit 37 consists of a plurality of series connected resistors 38 and multiplexer (MUX) 39 connected to junctions of the resistors 38. Control circuit 14 provides a digital signal to MUX 40 and in turn to MUX 39 for controlling the switching state thereof.

The output signal from voltage switching circuit 37 is applied to + input terminal of operational amplifier 41 whose output is amplified by voltage amplifier 42 to develop the calibration signal S having desired reference levels $+V_2$ and $-V_3$ output terminal 43. Voltage amplifier 42 is made by transistors 44a, 44b, 45a and 45b as well as the associated circuit components.

Output terminal 43 is connected to fixed terminal 47a of switch 47 through resistor 46 and also returned to ground through a serial circuit of resistor 48, potentiometer 49 and resistor 50. The movable contact of potentiometer 49 is connected to the other fixed terminal 47b of switch 47 whose movable contact 47c is connected to − input terminal of amplifier 41. The output signal from MUX 40 is supplied to the base of transistor 51, the collector of which is connected to relay coil 52 to drive switch 47. Switch 47 is a relay contact. The last mentioned circuit portion constitutes a feedback cicuit to change the amplification factor of amplifiers 41 and 42, depending on the setting of switch 47.

The circuit arrangement shown in FIG. 5 provides a stable DC voltage because of the use of Zener diode 27. The DC voltage is then supplied to amplifier 32 through switch 33. Proper selection of resistors 29 through 31 and 35 allows amplifier 32 to operate alternately as unity gain inverting or non-inverting amplifier, thereby generating a rectangular signal at the output terminal thereof. The maximum and minimum voltages of the rectangular signal are always very stable. Potentiometer 30 is used to correct any error of the associated resistors.

The stable output signal from amplifier 32 is supplied to voltage switching circuit 37 for switching the voltage depending on the instruction from control circuit 14 to develop the calibration signal S of appropriate amplitude on the output terminal 43 after amplification by amplifiers 41 and 42. For correcting the gain of amplifier 7 in FIG. 1, MUX 39 and switch 47 are controlled by the instruction from control circuit 14 depending on the settings of attenuator 4 and amplifiers 5 and 6, thereby switching or adjusting the voltages $+V_2$ and $-V_3$ of the calibration signal S on output terminal 43.

Figure 6:
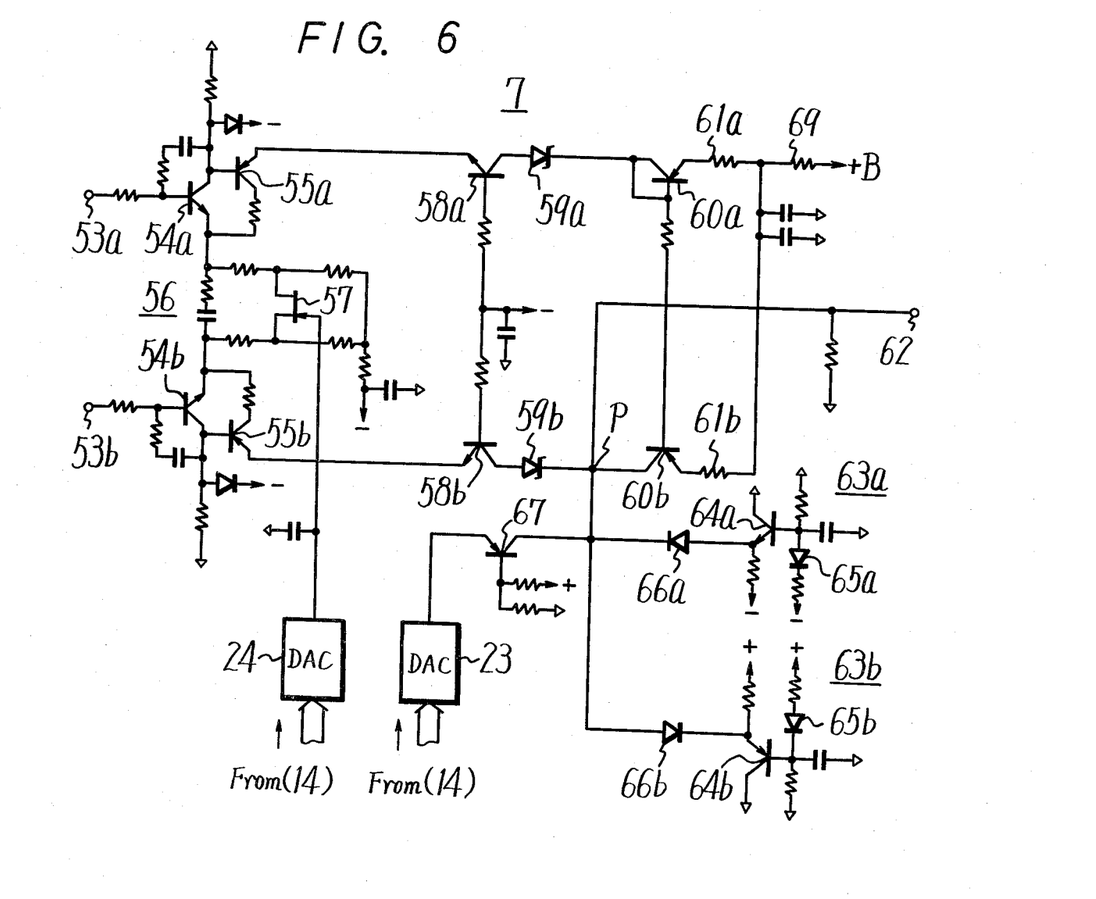
FIGS. 6 and 7 are alternative embodiments suitable for use as amplifier 7 in FIG. 1.

Shown in FIG. 6 is a schematic diagram of one exemplary amplifier 7 in FIG. 1. The push-pull output signal from front stage amplifier 6 is applied to input terminals 53a–53b. Such signal is then amplified by differential amplifier 56 comprising transistors 54a, 54b, 55a and 55b. Field effect transistor (FET) 57 is connected serially between emitters of transistors 54a–54b. The analog signal from third DAC 24 described earlier by reference to FIG. 1 is applied to the gate of FET 57 to control the drain-source impedance in accordance with the gate voltage. Therefore, the gain of differential amplifier 56 is controlled by modifying the impedance of FET 57.

The output end of transistor 55a is connected to +B voltage source through transistor 58a, diode 59a, transistor 60a, resistor 61b and resistor 69. Similarly, the output end of transistor 55b is connected to +B voltage source through transistor 58b, diode 59b, transistor 60b, resistor 61b and resistor 69. A node P is connected to output terminal 62.

There are also provided first and second clamp circuits 63a, 63b. First clamp circuit 63a comprises transistor 64a, diode 65a for setting the base potential of transistor 64a, and diode 66a and resistor connected to the output terminal (emitter in this particular embodiment) of transistor 64a. Second clamp circuit 63b is essentially the same as first clamp circuit 63a except the opposite polarity, therefore the corresponding circuit components are shown with similar reference numerals replacing the suffix a by b, and any description thereof is omitted. The output ends of diodes 66a and 66b are connected to the aforementioned node P.

It is designed that the output current from second DAC 23 described hereinbefore by reference to FIG. 1 is supplied to node P through transistor 67.

Apparently, the circuit as shown in FIG. 6 modifies the gain of differential amplifier 56 by varying the output analog signal from DAC 24 in accordance with the instruction from control circuit 14. The DC level of amplifier 7 on node P is controlled by superimposing the DC output current (control current) from second DAC 23 in accordance with control circuit 14.

Figure 7:
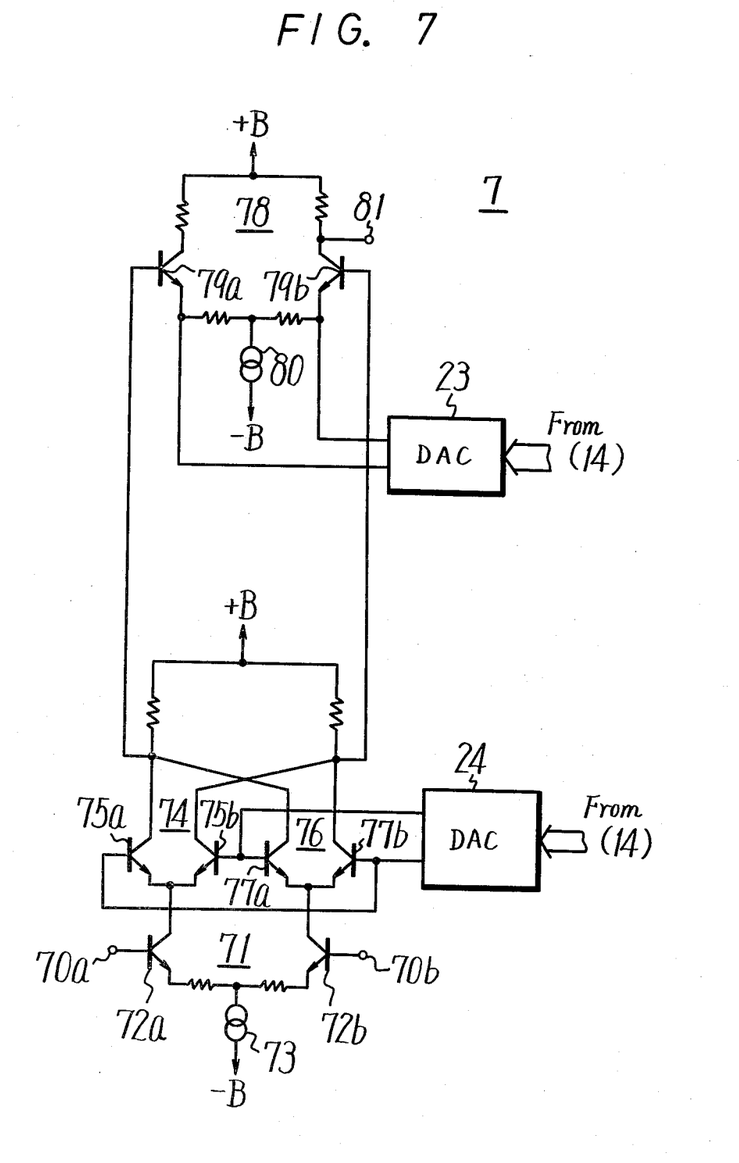

Another embodiment of third amplifier 7 is shown in FIG. 7. Input terminals 70a–70b are connected to the output terminals of second amplifier 6. The signal from a pair of input terminals 70a–70b is supplied to the bases of a pair of transistors 72a–72b constituting a differential amplifier 71. The output from transistors 72a–72b is then supplied to the emitters of transistors 75a–75b and 77a–77b constituting differential amplifiers 74 and 76. Differential amplifier 71 includes constant current source 73.

A push-pull output from third DAC 24 controlled by the instruction signal from control circuit 14 is supplied in parallel to differential amplifier 74 and 76 which are arranged to provide output signals in opposite polarity with each other. On varying the output signal from the third DAC 24, the gain of differential amplifiers 74, 76 is controlled, and the signal amplified by transistors 72a, 72b is gain controlled by amplifiers 74 and 76. Therefore, this circuit section constitutes the gain control circuit of third amplifier 7.

The push-pull output signal from the aforementioned circuit section is further supplied to the bases of a pair of transistors 79a and 79b constituting differential amplifier 78 including constant current source 80 and output terminal 81 connected to either one of transistors 79a, 79b (transistor 79b in this particular embodiment). The push-pull output signal from second DAC 23 is supplied to the emitters of transistors 79a, 79b. Therefore, the signal from the gain control circuit section is, of course, amplified by transistors 79a, 79b, but also modified in DC output current or bias by the control signal from control circuit 14 because the DC output signal from DAC 23 is applied to the emitters of a pair of transistors 79a, 79b, thereby modifying the DC level on the collector or output terminal 81 of transistor 79b. This circuit portion, therefore, constitutes a DC level correction circuit section.

Detailed circuits of amplifier 7 and calibration signal generation circuit 21 are described hereinbefore, they are for description purpose only and are not limited to these embodiments.

While I have shown and described a preferred embodiment of my invention, it will be apparent to those skilled in the art that many changes and modifications may be made without departing from my invention in its broader aspects. Therefore, the scope of the invention should be determined only by the following claims.

What I claim as being novel is:

1. A calibration apparatus for an analog-to-digital converter, comprising:
   circuit means for controlling the DC level and the amplitude of an input signal applied thereto, the output signal from said circuit means being applied to said analog-to-digital converter;

reference signal generator means for generating first, second and third reference levels to be applied to said circuit means, said first reference level being intermediate said second and third reference levels; and control means for controlling said circuit means in such a manner that the DC level of the output signal thereof is responsive to a digitized output from said analog-to-digital converter when the first reference level is applied to said circuit means, and that the amplitude of the output signal thereof is responsive to the difference between digitized outputs from said analog-to-digital converter when the second and third reference levels are applied to said circuit means.

2. A calibration apparatus for an analog-to-digital converter according to claim 1, wherein the first, second and third reference levels from said reference signal generator means are chosen to be substantially equal to the center, maximum and minimum levels of the input analog window of said analog-to-digital converter.

3. A calibration apparatus for an analog-to-digital converter according to claim 2, wherein said circuit means includes an attenuator of at least two selectable attenuation factor, and the values of the first, second and third reference levels from said reference signal generator means are adjusted in response to the selected attenuation factor of said attenuator.

4. A calibration apparatus for an analog-to-digital converter according to claim 1, wherein said control means includes a microprocessor which compares the digitized output from said analog-to-digital converter corresponding to the first reference level with a predetermined value for conrolling the DC level of the input signal to said circuit means, and which calculates the difference between the digitized outputs from said analog-to-digital converter corresponding to the second and third reference levels and compares the calculated difference with a predetermined value for controlling the amplitude of the input signal to said circuit means.

5. A calibration apparatus for an analog-to-digital converter according to claim 1, wherein the first reference level is ground level, and said reference signal generator means includes a square-wave signal generator for alternately generating positive and negative voltages forming the second and third reference levels.

6. A calibration apparatus for an analog-to-digital converter according to claim 1, wherein said reference signal generator mens is actuated whenever calibration is necessary.

7. A transient recorder, comprising:

an amplifier with controllable gain and DC level for amplifying an input analog signal;

an analog-to-digital converter for digitizing the output signal from said amplifier;

a memory for storing the digital output from said analog-to-digital converter;

a calibrator for generating three different reference levels to be applied selectively to the input of said amplifier; and a control circuit responsive to the digital outputs from said analog-to-digital converter when the reference levels are applied to said amplifier for controlling the DC level of said amplifier in response to the intermediate value of the digital outputs and for controlling the gain thereof in response to the difference between the maximum and minimum values of the digital outputs.

8. A transient recorder according to claim 7, wherein said calibrator generates a first reference level and second and third reference levels which are respectively higher and lower than the first reference level.

9. A transient recorder according to claim 8, wherein the second and third reference levels are substantially equal to the amplitude window of said transient recorder.

10. A transient recorder according to claim 8, wherein the first reference level is ground potential.

11. A transient recorder according to claim 7 further including a variable attenuator at the front stage of said amplifier.

12. A transient recorder according to claim 11, wherein said calibrator generates variable reference levels in response to the attenuation factor of said attenuator.

13. A transient recorder according to claim 7, wherein said control circuit includes a microprocessor which compares the intermediate value of the digital outputs with a predetermined value for controlling the DC level of said amplifier, and which calculates the difference between the maximum and minimum values of the digital outputs and compares the calculated difference with a predetermined value for controlling the gain of said amplifier.

14. A transient recorder according to claim 7, wherein said calibrator is actuated manually or automatically before digitizing the input analog signal.

* * * * *